United States Patent [19]
Schelen

[11] Patent Number: 5,349,489
[45] Date of Patent: Sep. 20, 1994

[54] INTEGRATED SEMICONDUCTOR CIRCUIT WITH POLARITY REVERSAL PROTECTION

[75] Inventor: Johannes B. J. Schelen, Den Haag, Netherlands

[73] Assignee: B.V. Optische Industrie "De Oude Delft", Delft, Netherlands

[21] Appl. No.: 573,171

[22] PCT Filed: Nov. 9, 1989

[86] PCT No.: PCT/EP89/01401

§ 371 Date: Dec. 12, 1991

§ 102(e) Date: Dec. 12, 1991

[87] PCT Pub. No.: WO90/06012

PCT Pub. Date: May 31, 1990

[30] Foreign Application Priority Data

Nov. 18, 1988 [NL] Netherlands .......................... 8802852

[51] Int. Cl.$^5$ .............................................. H02H 9/00
[52] U.S. Cl. ........................................ 361/77; 361/58; 361/88; 320/25
[58] Field of Search ...................... 361/98, 77, 82, 84, 361/88, 58, 54; 320/25; 307/202

[56] References Cited

U.S. PATENT DOCUMENTS 3,593,101  7/1971  Wassink ............................. 320/25
3,829,709  8/1974  Maigret et al. ..................... 307/202

Primary Examiner—A. D. Pellinen
Assistant Examiner—S. Jackson
Attorney, Agent, or Firm—Louis E. Marn

[57] ABSTRACT

An integrated semiconductor circuit for use in a low voltage (1.5-2 V) battery operated device is provided with a protection circuit against reverse connection of the battery.

The protection circuit takes care that the substrate is always connected to one extreme potential and a region containing one or more resistors is always connected to the other extreme potential irrespective of the proper or reverse mode of connection of the battery. The protection circuit has been designed in such a way that no voltage drop occurs between the battery connections and the supply voltage connection terminals of the integrated semiconductor circuit.

5 Claims, 1 Drawing Sheet

INTEGRATED SEMICONDUCTOR CIRCUIT WITH POLARITY REVERSAL PROTECTION

The invention relates to a circuit comprising an integrated semiconductor circuit and a protection circuit, which integrated semiconductor circuit comprises a number of components provided on a substrate, which components are each surrounded by a region of a particular conductivity type, and which integrated semiconductor circuit is provided with at least two supply voltage connection terminals and a connection terminal which is coupled to the region of a particular conductivity type.

Integrated semiconductor circuits whose components are manufactured, for example, with the aid of an epitaxial procedure are generally known and are also used on a large scale because the epitaxial procedure is simple, satisfactorily reproducible and cheap.

If the components are epitaxial n-p-n transistors, the region of a particular conductivity type which surrounds an n-p-n transistor is a p-type substrate. An integrated circuit of this type contains a parasitic p-n-p transistor formed by the p-type base, the n-type collector and the p-type substrate. This transistor should always be kept in the off-state in order to be able to guarantee the normal operation of the circuit and because such high currents are otherwise able to flow that one or more p-n junctions break down, which generally means that the integrated circuit has become unusable. For this purpose, it is known to connect the substrate to the most negative voltage in the circuit.

A problem arises, however, if the supply voltage of the integrated circuit is accidentally incorrectly connected, i.e. the positive terminal of the circuit is connected to the negative terminal of the supply source and the negative terminal of the circuit to the positive terminal of the supply source. The substrate is then suddenly connected to the most positive voltage in the circuit and the parasitic p-n-p transistor may be turned on completely, which will result in such high currents that the circuit becomes unserviceable.

Diverse solutions have already been proposed for this problem. Thus, it is possible to include in the integrated circuit a bridge circuit comprising four diodes between the external supply voltage terminals and the internal supply voltage terminals for the circuit, which makes it possible to guarantee at all times a correct polarity for the circuit and therefore also for the substrate regardless of the polarity of the supply voltage connected, with the result that the circuit will function in the correct manner at all times. It is also possible to include, between an external and an internal supply voltage terminals, a single diode which only conducts if the supply voltage is connected in the correct manner, with the result that although the circuit does not function if a supply voltage having an incorrect polarity is connected, it is also unable to become unserviceable.

A drawback of each of these solutions is that a voltage drop of approximately 0.6 V always occurs over a diode in the conducting state. If, therefore, the external supply voltage is relatively low, for example a battery supply of 1.5 to 2 V, said voltage drop is so large that the actual supply voltage for the circuit, 0.9 to 1.4 V, is too low to make satisfactory functioning possible. In particular, this relatively high voltage drop is disadvantageous if a circuit which is supplied is a high-voltage supply circuit in which use is made of, for example, a diode ladder for the voltage multiplication. The practically achievable high voltage will then be lower by the same amount with respect to the maximum possible high voltage than the actual supply voltage with respect to the supply voltage delivered by the supply source, such as a battery.

The object of the invention is to offer a solution for this problem as a result of which, even with relatively low external supply voltages, an incorrect polarity of the supply voltage source connected to an integrated circuit cannot result in said circuit becoming unserviceable, without the value of the external supply voltage and the value of the supply voltage actually available for the circuit within the integrated circuit substantially differing from each other if the polarity is correct.

For this purpose the invention provides a circuit of the abovementioned type which is characterized in that the protection circuit comprises two input terminals and an output terminal, in that a first input terminal is coupled to a first supply voltage connection terminal, in that the second input terminal is coupled to a second supply voltage connection terminals, in that the output terminal of the protection circuit is coupled via the connection terminal to the region of a particular conductivity type, and in that the protection circuit provides a conduction path between the output terminal and the input terminal having the most extreme potential, which most extreme potential is the most positive potential in the event that the region has an n-type conductivity and the most negative potential in the event that the region has a p-type conductivity.

According to a preferred embodiment of the invention the protection circuit comprises two transistors and two resistors, the base electrode of the first transistor being coupled via a resistor to the first input terminal, the emitter electrode to the second input terminal and the collector electrode to the output terminal and the base electrode of the second transistor being coupled via the other resistor to the second input terminal, the emitter electrode to the first input terminal and the collector electrode to the output terminal.

If the substrate is a p-type substrate, which is most usual in the case of epitaxially constructed transistors, the transistors of the circuit according to the invention are of the n-p-n type and the output terminal of the circuit is coupled to the substrate.

According to the invention, these measures ensure, as will be explained in more detail below, that the substrate is at all times at a supply potential such that the parasitic transistors cannot be turned on.

Preferably the protection circuit of the circuit according to the invention is included in the same substrate as the integrated semiconductor circuit, so that the transistors and resistors are subjected to the same temperature effects and the like as the other components of the circuit and will function adequately at all times.

The principle on which the invention is based can also be advantageously used if the integrated semiconductor circuit comprises one or more resistors as components. Resistors of this type are formed in the epitaxial procedure at the same time as the base diffusion by providing in the n-type epitaxial layer p-type regions, each of which regions is able to function as a resistor in a manner known per se. In this case, however, it is necessary to keep the n-type epitaxial layer which surrounds the resistor or resistors at the most positive potential of the circuit in order to keep the p-n junction reverse-biased at all times. This is because, in the case of resistors, p-n-p transistors are also present, either between two resistors or between a resistor, the epitaxial region and the p-type substrate.

Parasitic p-n-p transistors of this type can be turned on if the potential of a resistor becomes higher than that of the n-type region and may result in such high short-circuit currents that one or more p-n junctions in the circuit break down, as a result of which the circuit becomes unserviceable.

This problem, too, can also be eliminated in the known manner with the aid of a bridge circuit of diodes or with the aid of a single diode, but, with relatively low external supply voltages, these known solutions again have the drawback that, as a consequence of the voltage drop over a diode which has been turned on, the supply voltage actually available for the circuit becomes too low. The object of the invention is also to offer a solution for this problem in the event that use is made of relatively low supply voltages.

In an integrated semiconductor circuit in which the components comprise p-type resistors formed in an n-type conductivity region by diffusion, the transistors of the protection circuit are of the p-n-p type.

As will also be explained below, these measures ensure that the epitaxial region which surrounds the p-type resistor regions are at all times at a supply voltage such that the parasitic transistors present cannot be turned on.

The invention will be explained in more detail below on the basis of two exemplary embodiments with reference to the drawing. In the latter:

Figure 1:
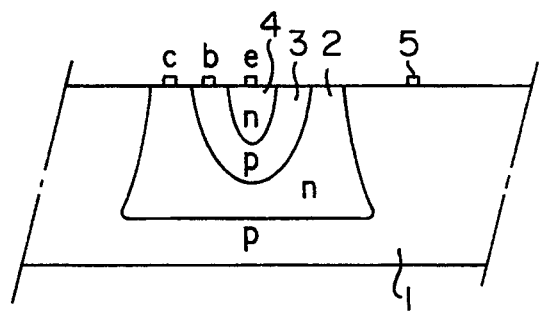
FIG. 1 shows a diagrammatic cross-section of an n-p-n transistor formed according to the epitaxial procedure.

FIG. 1 shows an n-p-n transistor which has been formed in a manner known per se according to an epitaxial procedure on a p-type substrate 1 and which comprises an n-type collector region 2 which is formed from a section of an n-type epitaxial layer, a p-type base region 3 which is formed by a p-type diffusion in the collector region 2, and an n-type emitter region 4 which is formed by an n-type diffusion in the base region 3. Each of the regions 2, 3 and 4 is provided with respective connection terminals which are indicated by c, b and e. In addition, a connection terminal 5 is provided for the substrate.

As is event from FIG. 1, a parasitic p-n-p transistor is formed by the p-type substrate 1, the n-type collector region 2 and the p-type base region 3. To prevent said parasitic transistor being turned on, it is necessary for the substrate 1 to be connected at all times to the most negative potential which is present in the integrated circuit of which the transistor shown forms part. For this purpose, the connection terminal 5 for the substrate is usually interconnected internally in the integrated circuit with the supply voltage connection terminal for the most negative supply voltage of an external supply voltage source. If the polarity of the external supply voltage source is inadvertently reversed, as a result of which the supply voltage connection terminal of the integrated circuit for the most negative supply voltage is connected to a higher or the highest supply voltage, the parasitic p-n-p transistor may, however, in fact be turned on and in particular, if the voltage connected to said connection terminal is the highest supply voltage, uncontrolled high currents may be able to flow which cause one or more of the p-n junctions to break down.

According to the invention, a solution is found for this problem which ensures at all times that the substrate is connected to the most negative potential, without a voltage drop occurring under these circumstances which causes the supply voltage available for the integrated circuit to be lower than the supply voltage delivered by the external voltage source.

Figure 2:
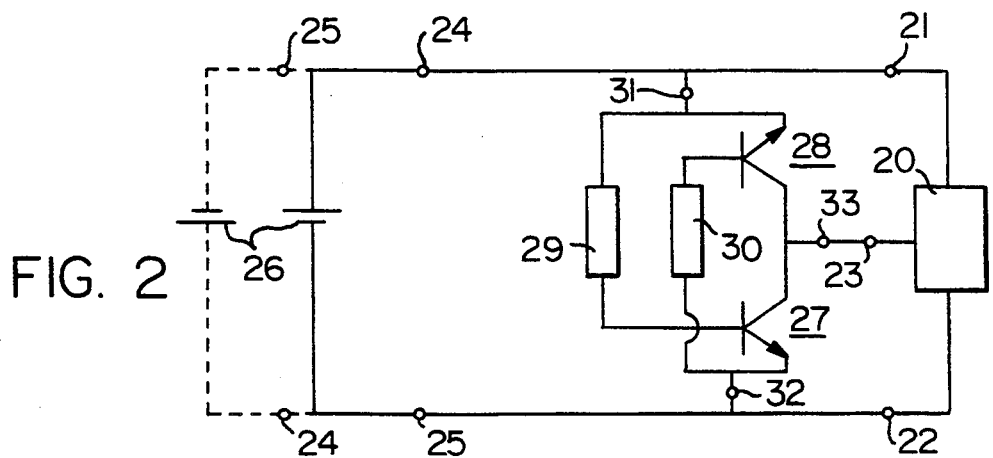
FIG. 2 shows the diagram of a circuit according to the invention for ensuring the correct potential for the substrate on which the transistor according to FIG. 1 is formed.

FIG. 2 shows the circuit according to the invention included between a supply voltage source 26 having a negative connection terminal 25 and a positive connection terminal 24, and a diagrammatically shown integrated circuit 20 having a connection terminal 21 for the positive supply voltage and a connection terminal 22 for the negative supply voltage, which integrated circuit is also provided with a connection terminal 23 for the substrate, which terminal is therefore interconnected internally in the integrated circuit with connection terminal 5.

The polarity reversal protection circuit according to the invention has two input terminals 31 and 32 and an output terminal 33 which is coupled to the connection terminal 23 for the substrate.

The circuit comprises two n-p-n transistors 27 and 28 and two resistors 29 and 30. The resistor 29 is coupled between the input terminal 31 and the base of the transistor 27 and the resistor 30 is coupled between the input terminal 32 and the base of the transistor 28. The emitter of the transistors 27 and 28 are respectively connected to the input terminals 32 and 31 and the collectors of the transistors 27 and 28 are coupled to each other and to the output terminal 33.

The polarity reversal protection circuit operates as follows. If the supply voltage source 26 is connected in the correct manner as shown in continuous lines in FIG. 2, i.e. with the positive connection terminal 24 connected to the connection terminal 21 of the integrated circuit 20 and with the negative connection terminal 25 connected to the connection terminal 22 of the integrated circuit, input terminal 31 is also connected to the positive supply voltage and the input terminal 32 to the negative supply voltage. Consequently, n-p-n transistor 27 will be completely turned on and n-p-n transistor 28 will be in the off-state. Because transistor 27 is completely turned on, a conduction path is produced between input terminal 32 and output terminal 33, as a result of which the negative supply voltage for the substrate is available at output terminal 33. The fact that no voltage drop occurs over the completely turned on transistor 27 ensures that the substrate voltage is equal to the most negative potential available. In addition, no voltage loss occurs between the terminals 24 and 21 on one hand and the terminals 25 and 22 on the other hand, with the result that the full voltage of supply voltage source 26 is available over the integrated circuit, which is of great importance, especially in the case of low supply voltages.

If the supply voltage source 26 is inadvertently incorrectly connected, i.e. with the negative connection terminal 25 connected to the connection terminal 21 of the integrated circuit 20 and with the positive connection terminal 24 connected to the connection terminal 22, the integrated circuit will not be able to function, but owing to the protection circuit according to the invention, will also be unable to become unserviceable. This is because if a supply voltage is incorrectly connected in this manner, transistor 27 will be reverse-biased and transistor 28 will then be completely turned on. Consequently, a conducting path is now produced between output terminal 32 and the input terminal 31, as a result of which the substrate is again connected to the most negative potential available, with the result that parasitic p-n-p transistors in the integrated circuit cannot be turned on.

Figure 3:
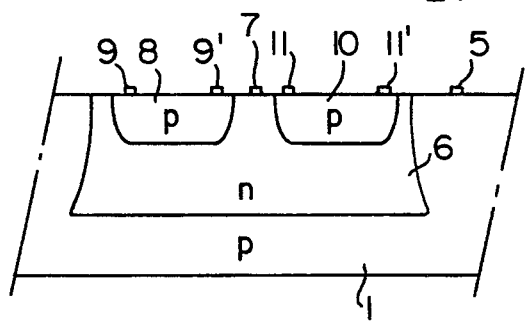
FIG. 3 shows a diagrammatic cross-section of two resistors formed in an n-type epitaxial region.

FIG. 3 shows diagrammatically the manner, known per se, in which a p-type resistor region 8 having connection terminals 9 and 9' and a p-type resistor region 10 having connection terminals 11 and 11' are formed on the p-type substrate having an epitaxial region 6 of the n-type thereon. The epitaxial region 6 which is provided with a connection terminal 7, forms part of the same epitaxial layer as that from which the collector region 2 of the transistor according to FIG. 1 is formed. In other respects, identical components in FIGS. 1 and 3 are indicated by identical reference numerals. In the configuration shown in FIG. 3, parasitic p-n-p transistors are present which comprise two p-type resistors 8 and 10 and the intervening epitaxial n-type region 6 and also one of the p-type resistor regions, the n-type epitaxial region 6 and the p-type substrate 1. To prevent one of said parasitic transistors being turned on, again with all the disastrous consequences described above, it is usual to connect the n-type epitaxial region 6 internally in the integrated circuit to the connection terminal for the most positive potential, which in principle ensures that a p-n junction of which the n-type epitaxial region 6 forms part can never be turned on.

Figure 4:
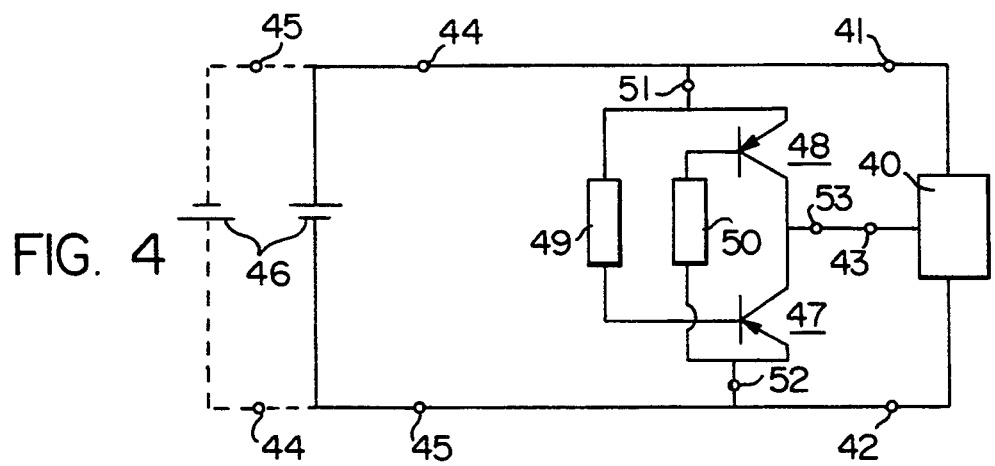
FIG. 4 shows the diagram of a circuit according to the invention for ensuring the correct polarity for the epitaxial region in which the resistors according to FIG. 3 are formed.

If, however, the external supply voltage source is inadvertently incorrectly connected, the n-type region 6 is connected to a lower or even to the most negative potential, as a result of which one or more of the parasitic p-n-p transistors can in fact be turned on and such high currents are able to flow that one or more p-n junctions break down. The idea explained on the basis of FIG. 2 and underlying the invention can also offer a solution in this case. The polarity reversal protection circuit according to the invention needed for this purpose is shown in FIG. 4, in which figure all the corresponding components have the same reference numerals as in FIG. 2 but increased by 20. The circuit according to FIG. 4 is in fact completely identical to that according to FIG. 2, with the exception of connection terminal 43 which is connected to the epitaxial region 6 in the integrated circuit 40, that is to say, to the connection terminal 7 according to FIG. 3, and the transistors 47 and 48, which are now of the p-n-p type.

If the supply voltage source 46 is correctly connected as shown in the figure in a continuous line, p-n-p transistor 48 is fully turned on and transistor 47 is reverse-biased, with the result that the output terminal 53, and therefore the n-type epitaxial region 6, are coupled to the highest potential. If the supply voltage source 46 has been incorrectly connected as shown in a dotted line, the integrated circuit 40 does not function but it does not become unserviceable either. The reason is that transistor 47 now conducts and transistor 48 is reverse-biased, with the result that the output terminal 53, and therefore the n-type epitaxial region, remain connected to the most positive potential and the parasitic p-n-p transistors cannot be turned on.

The protection circuit according to FIG. 4 obviously has the same advantages as that according to FIG. 2, in particular that no loss occurs in the supply voltage available for the integrated circuit.

Although the protection circuits shown in FIGS. 2 and 4 may be placed outside the integrated circuit, it will be clear that they are preferably included in the integrated circuit itself. As a result of this, possible errors in connecting the protection circuit such as interchanging the input and output terminals are avoided, and the components of the circuit are subject to precisely the same environmental effects and ageing phenomena as the components of the integrated circuit itself, which ensures an optimum reliable functioning.

It is obviously possible to include one of the two circuits according to FIG. 2 or FIG. 4 in an integrated circuit, but if the integrated circuit contains transistors of the type shown in FIG. 1 and resistors of the type shown in FIG. 3, both circuits are preferably provided, one for the substrate and one for the epitaxial region in which resistors have been formed. If, however, resistors are used which have not been manufactured according to an epitaxial procedure and which are completely insulated from the rest of the circuit, as, for example, Ni-Cr resistors formed on the $SiO_2$ top layer of an integrated circuit, it is possible to make do with the circuit according to FIG. 2.

It is pointed out that in the event of an n-type substrate and a p-type epitaxial layer being used, the circuit according to FIG. 2 is suitable for protecting a p-type epitaxial region in which n-type resistors have been formed against polarity reversal and the circuit according to FIG. 4 for protecting an n-type substrate on which p-n-p transistors have been formed.

Finally it is furthermore pointed out that the external supply voltage in the case of the circuits according to FIGS. 2 and 4 must not be higher than the base-emitter zener voltage of the transistors 27, 28 or 47, 48 respectively. This should certainly not, however, be a problem in the case of lower external supply voltages.

It will furthermore be clear that there are equivalents of the protection circuits according to FIGS. 2 and 4, for example circuits in which thyristors are used instead of transistors, which circuits function in the same manner as the circuits shown and are therefore also considered to fall within the invention as described in the claims.

I claim:

1. A circuit, which comprises:
   a supply voltage source having negative and positive connection terminals;
   an integrated semiconductor circuit including a number of components surrounded by a region of particular conductivity provided on a substrate, positive and negative connection terminals and a connection terminal to said region of particular conductivity, said positive and negative connection terminals of said integrated semiconductor circuit connected to said positive and negative connection terminals of said supply voltage source; and
   a protection circuit having two input terminals and an output terminal, said input terminals connected to said negative and positive connection terminals of said supply voltage source and of said integrated semiconductor circuit, said output terminal connected to said connection terminal of said semiconductor circuit, said protection circuit providing a conduction path between said output terminal and said input terminal having a most extreme potential, said most extreme potential being a most positive potential when said region is of n-type conductivity and a most negative potential when said region is of p-type conductivity.

2. The circuit as defined in claim 1 wherein said circuit means of said protection circuit includes first and second transistors and first and second resistors, a base electrode of said first transistor coupled via said first resistor to a first input terminal, an emitter electrode of said first transistor coupled to a second input terminal, a collector of said transistor coupled to said output terminal, a base electrode of said second transistor coupled via said second resistor to said second input terminal, a base electrode of said second transistor coupled to said first input terminal and a collector of said second transistor coupled to said output terminal.

3. The circuit as defined in claim 2 wherein said components of said integrated semiconductor circuit comprise n-p-n transistors wherein said region of particular conductivity is said substrate and is of a p-type conductivity and wherein said transistors are of an n-p-n type.

4. The circuit as defined in claim 2 wherein said components of said integrated semiconductor circuit comprise p-type resistors surrounded by a region of n-type conductivity and wherein said transistors are of an p-n-p type.

5. The circuit as defined in claims 1, 2, 3 or 4 wherein said protection circuit is formed on said substrate of said integrated semiconductor circuit.

* * * * *